United States Patent [19]

Johnson

[11] Patent Number: 5,675,609
[45] Date of Patent: Oct. 7, 1997

[54] SINUSOIDAL PULSE AND PULSE TRAIN SIGNALING APPARATUS

[75] Inventor: Raymond Edward Johnson, Vermillion, S. Dak.

[73] Assignee: Dakota Research, Inc., Vermillion, S. Dak.

[21] Appl. No.: 451,400

[22] Filed: May 26, 1995

[51] Int. Cl.[6] .................. H03K 7/00; H03K 9/00
[52] U.S. Cl. .................. 375/237; 375/238; 375/239; 375/259; 375/353; 329/311; 332/106; 332/108
[58] Field of Search .................. 375/237, 238, 375/239, 259, 295, 340, 343, 353; 329/311, 312, 313; 332/106, 108, 109, 110, 111, 112, 113, 114, 115, 116

[56] References Cited

U.S. PATENT DOCUMENTS

| | | | |
|---|---|---|---|
| 2,535,061 | 12/1950 | Grieg | 375/353 |
| 2,654,027 | 9/1953 | Baum | 375/239 |
| 2,916,618 | 12/1959 | Adams et al. | 375/340 |
| 2,948,854 | 8/1960 | Bess | 375/238 |
| 3,299,404 | 1/1967 | Yamarone et al. | 375/340 |
| 3,329,774 | 7/1967 | Bradmiller | 375/295 |
| 3,366,882 | 1/1968 | Briley | 375/238 |
| 3,566,033 | 2/1971 | Young | 375/295 |
| 3,644,677 | 2/1972 | Cecchin et al. | 375/238 |
| 3,784,754 | 1/1974 | Hagiwara et al. | 375/259 |
| 4,257,108 | 3/1981 | Igel | 375/238 |
| 4,313,203 | 1/1982 | Van Gerwen et al. | 375/343 |
| 4,336,615 | 6/1982 | Abt et al. | 375/238 |
| 4,817,115 | 3/1989 | Campo et al. | 375/238 |
| 4,914,396 | 4/1990 | Berthiaume | 332/109 |

FOREIGN PATENT DOCUMENTS

| | | | |
|---|---|---|---|
| 0 503 761 | 9/1992 | European Pat. Off. | 375/238 |
| 2-19021 | 1/1990 | Japan | 375/238 |

*Primary Examiner*—Stephen Chin
*Assistant Examiner*—Jeffrey W. Gluck
*Attorney, Agent, or Firm*—Konneker & Smith, P.C.

[57] ABSTRACT

This contribution involves the generation, transmission, propagation and selective reception of electrical, magnetic or electromagnetic energy in the form of a halfwave sinusoidal pulse signal, from one location to another, whereby intelligence input for transmission is recovered from one sinusoidal pulse, or from a plurality of sinusoidal pulses. In a transmitter embodiment, one or more sinusoidal halfwave pulse generators are provided, where each pulse signal may be generated asynchronously, with varying polarity, duration and amplitude on a continuous serial sampled information basis. Complementary pulse signal filtering and recovering of transmitted intelligence is provided in a signal receiver embodiment. Another transmitter embodiment includes a software-driven signal synthesizing capability, wherein a plurality of timed sinusoidal halfways pulses are linearly summed as elementary signal components of an information-carrying propagable signal.

9 Claims, 8 Drawing Sheets

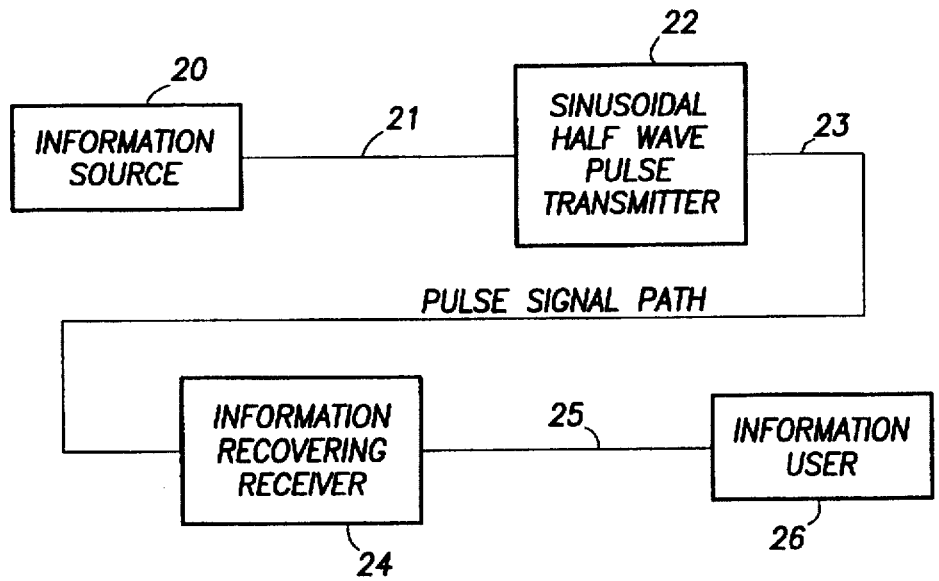
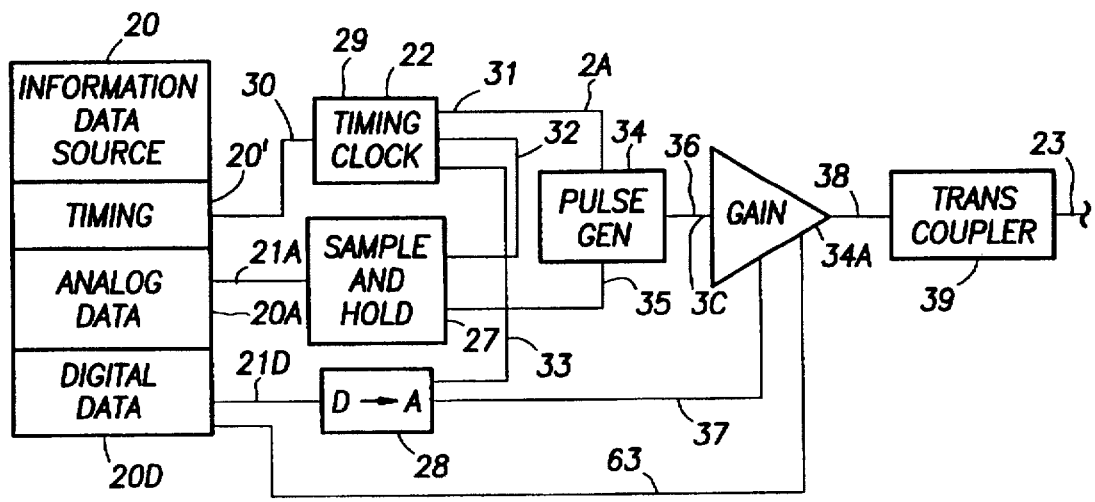

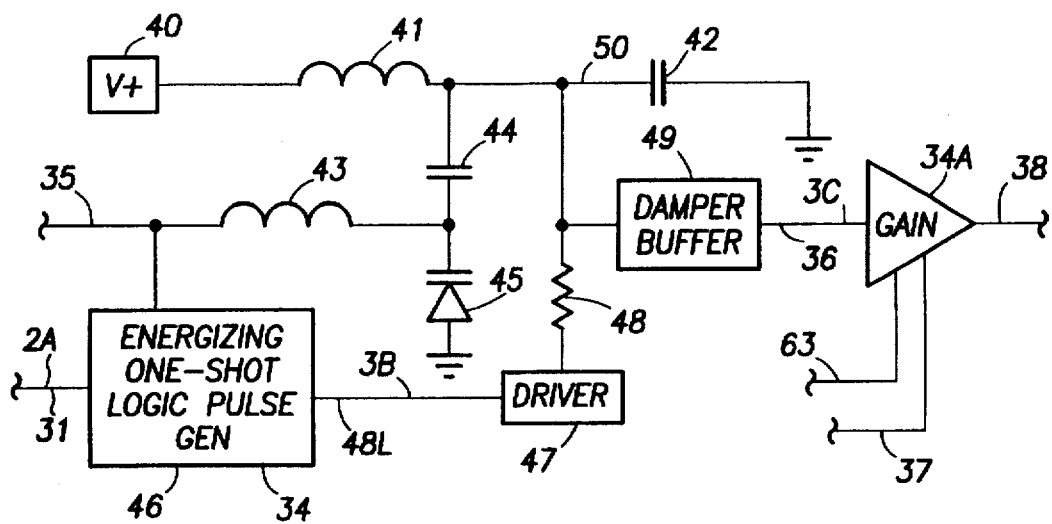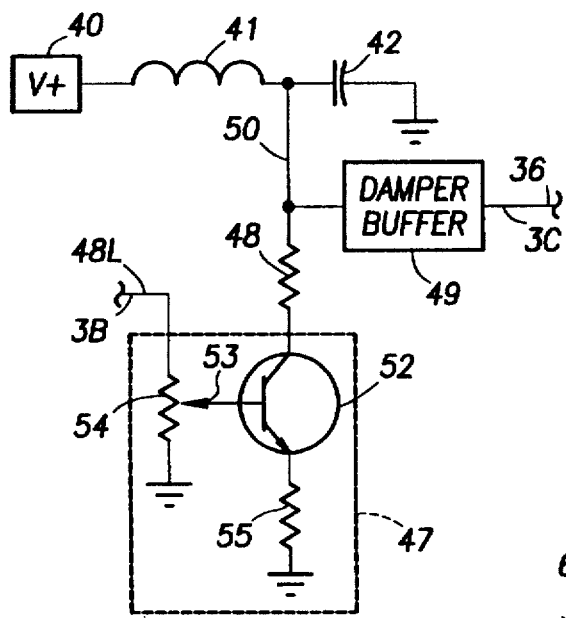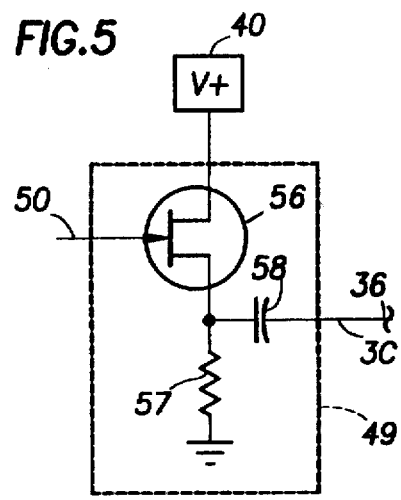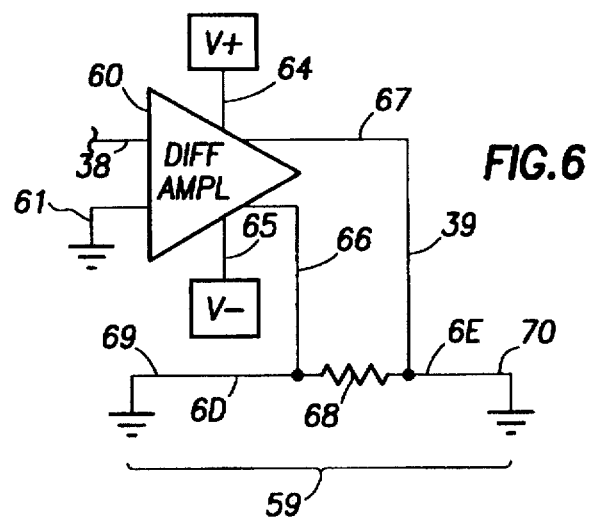
FIG.3
FIG.4
FIG.5
FIG.6

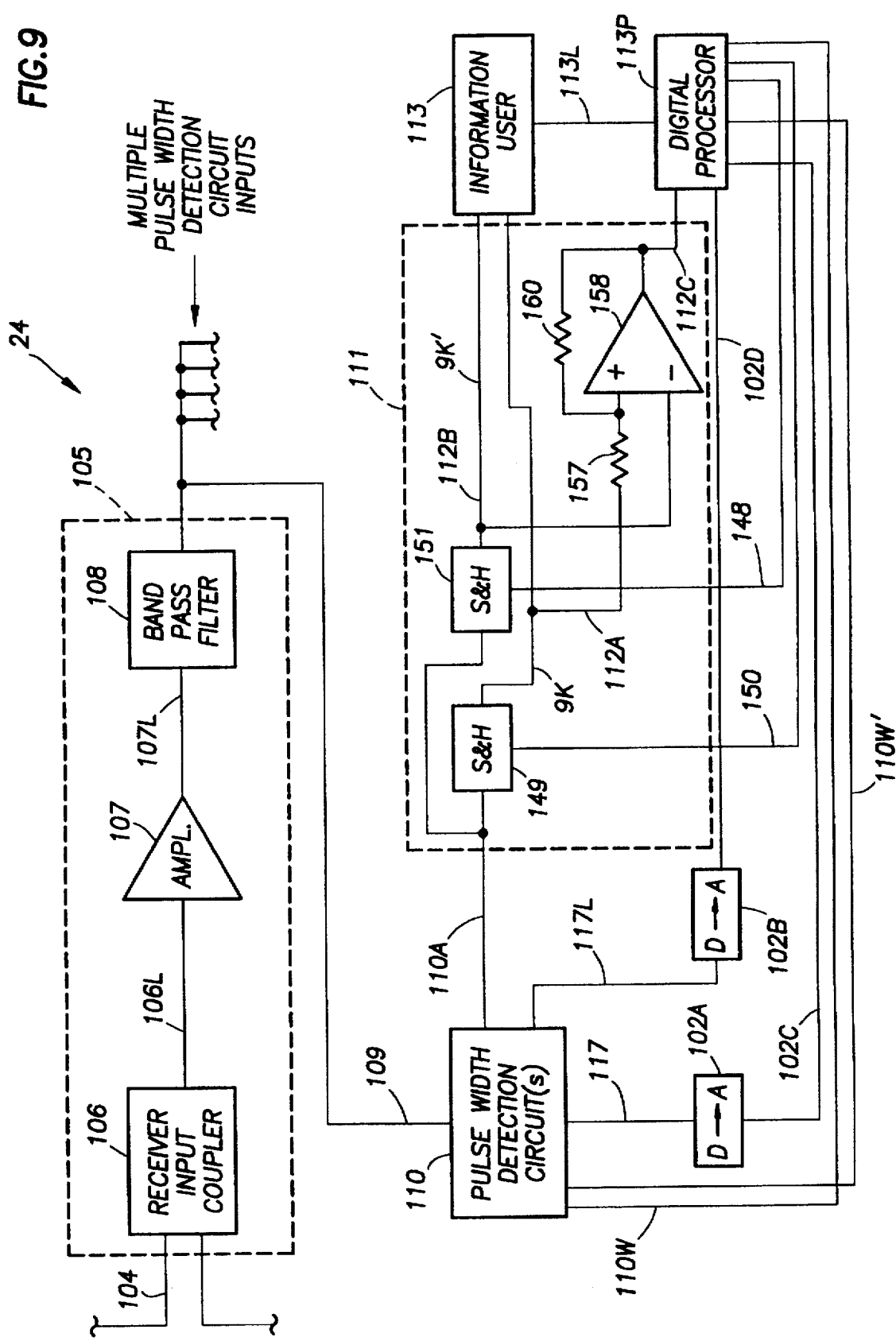

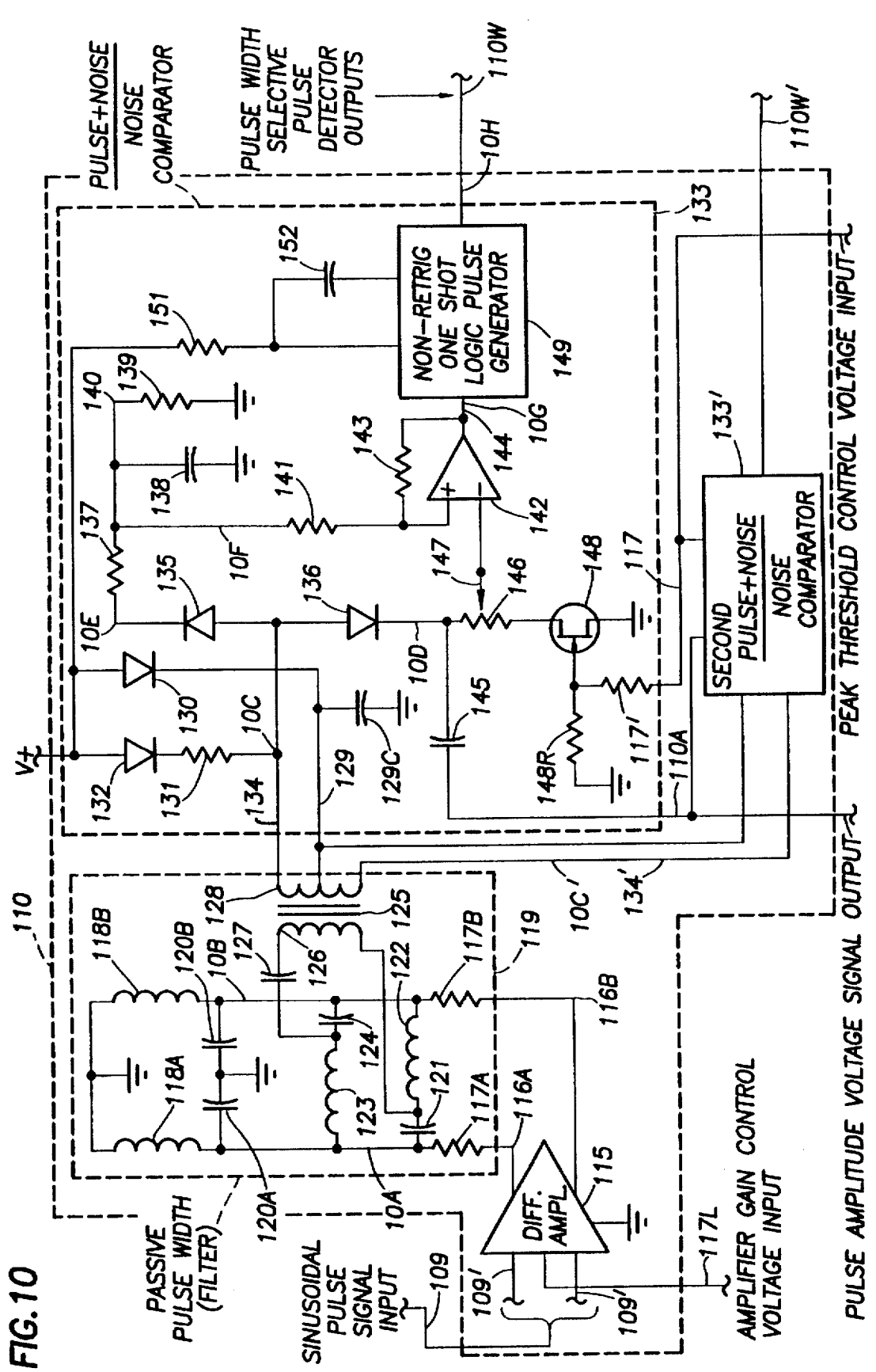

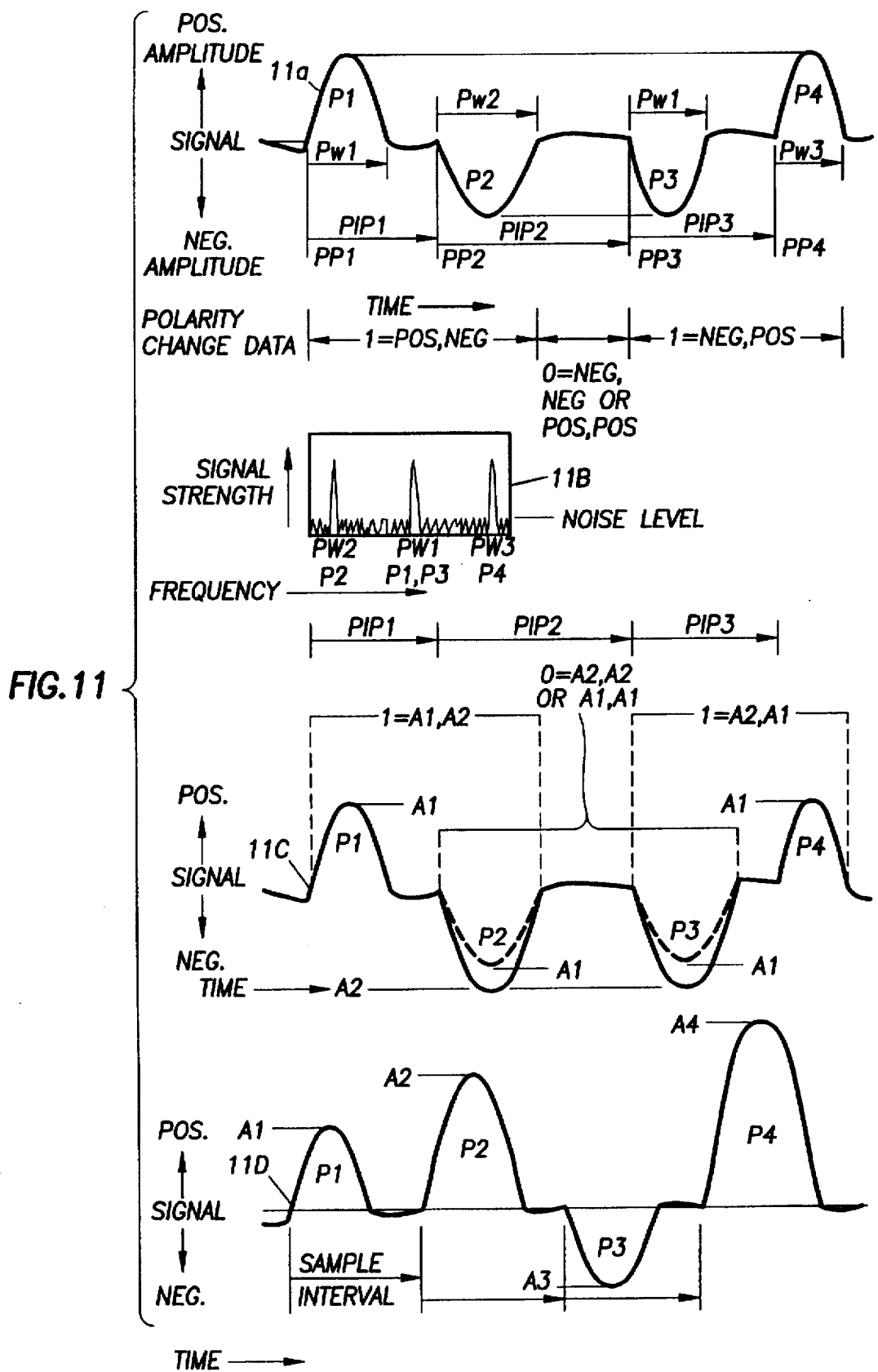

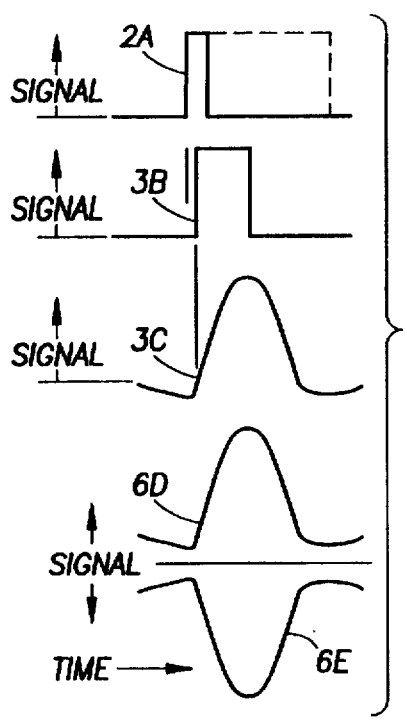
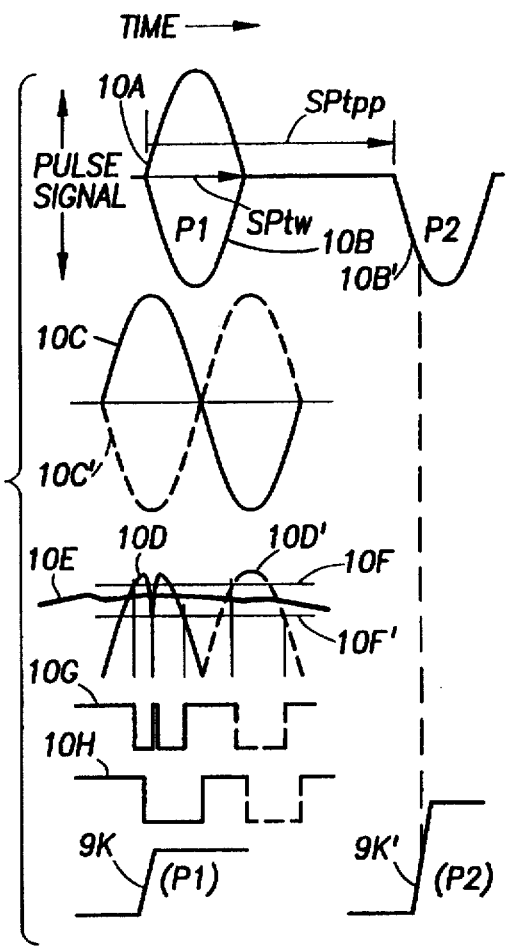
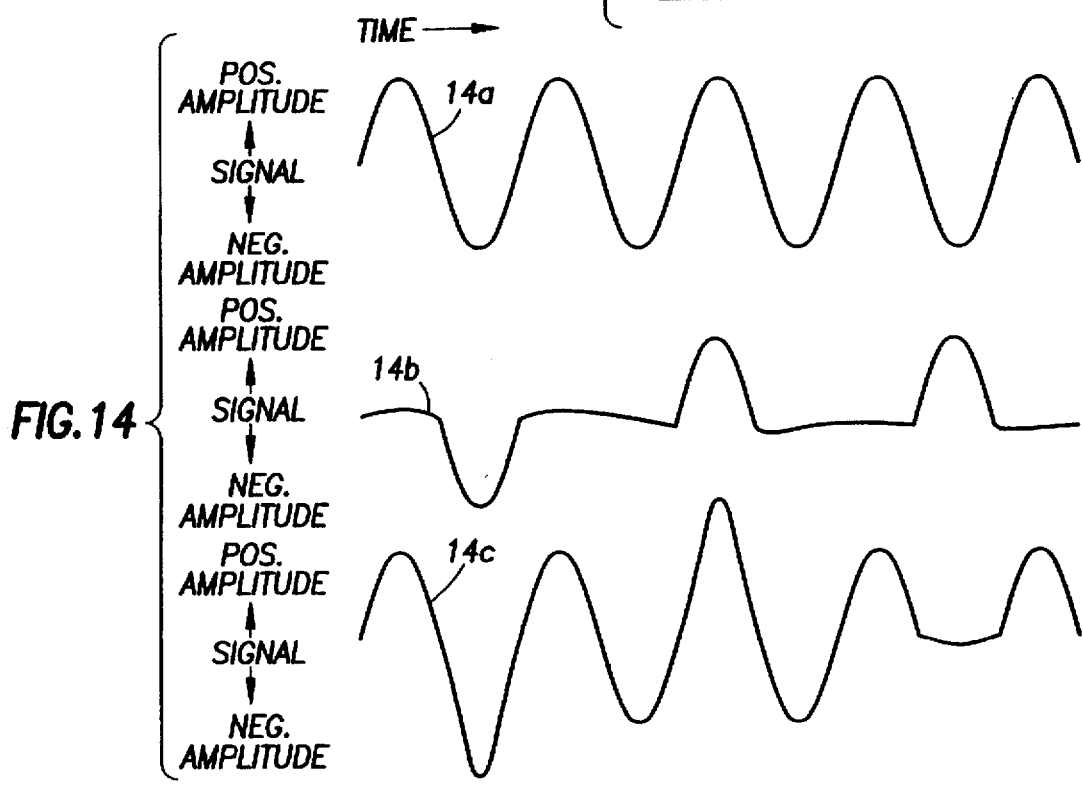

SINUSOIDAL PULSE AND PULSE TRAIN SIGNALING APPARATUS

This invention relates in general, but not exclusively, to information transmission systems, whether by wire, fiber-optics, laser beam, electrical, magnetic, electromagnetic or other space propagation signal transfer from a transmitter or transmitters to a receiver or receivers via a single sinusoidal halfwave signal or via a plurality of synchronous halfwave sinusoidal pulse train carriers of signaling on a serial information source sampled basis.

Historically, free space propagable signals have been produced via the modification of a pre-existing continuous sinusoidal signal (i.e. a pristine carrier having no deviation of phase, duration or amplitude). Therefore, different types of modulators are required to produce different types of modulated carriers.

In any analog transmission system, signal propagation may be described as a train of analog signatures, where each identifiable signature relates to some quantity of information or intelligence. In the present invention, the elementary signature is a sinusoidal halfwave signal having three information bearing characteristics (parameters): width or duration as measurable in units of time, amplitude or power content as measured in terms of energy and time, and binary polarity (halfwave phase). A fourth information-carrying parameter is added as pulses are sequentially generated, forming a pulse train, wherein the time between pulses conveys information. The detection of a single pulse transmission within a pre-determined time period can also be used to convey information. Whereas the transmission of a single sinusoidal pulse may convey information via the pulse's width, and, in some cases, amplitude, pulse trains convey information in additional various ways. Methods involving sinusoidal pulse signal generation include generating trains of discrete, very nearly sinusoidal, pulses of different widths, thereby producing continuous carrier phase/frequency modulation (F/M). Another method involves the generation of discrete pulses having different amplitudes, which produces continuous carrier amplitude modulation (AM).

Pertaining to signal transmission in a communication system, a priority of the present invention is to provide flexible and potentially universal generation or synthesis of information-carrying, electromagnetically propagable, intermittent or continuous signals using a fundamental elementary sinusoidal halfwave pulse generating circuit or circuits in a transmitter embodiment. Pertaining to reception in a communication system, a priority of the present invention is to provide flexible and accurate recovery of information from a single sinusoidal halfwave pulse or from a train of sinusoidal halfwave pulses, utilizing an elementary sinusoidal signal-detecting circuit or circuits in a receiver embodiment. Herein, sinusoidal refers to a signal form, the energy content of the signal as measured in the frequency domain being essentially that of a single frequency, adjacent channel and spurious energy considered negligible, and pulse refers to a sinusoidal halfwave of energy, generated, transmitted, propagated, selected, etc.; the only exception being digital timing pulses.

A principle object of the present invention is to provide a method and apparatus for generating a propagable signal on a piece-wise or segmental basis, where each signal piece or segment may be integrated into a continuous signal, which may be conditioned for maximum transmission efficiency in terms of transmission time, power and frequency spectrum used.

Another principle object is to provide a signal transmission apparatus capable of synthesizing a signal via the superposition (linear summation) of multiple inverse Fourier sinusoidal pulse trains, thereby generating a signal compatible with a conventional receiver equipped to demodulate any type of continuous carrier modulation.

Another principle object is to provide a sinusoidal halfwave signal generating apparatus, utilizing a resonating circuit or device, configured in such a way as to generate a single halfwave pulse as the fundamental information-carrying signal entity of a transmission system. One or more elementary signal generators may be configured in a transmitter capable of generating a propagable signal.

A further principle object is to provide an elementary sinusoidal halfwave pulse width selective receiver.

Other objects of the invention include:

Associated with the elementary signal generator previously mentioned, control inputs and circuitry to vary pulse width and/or amplitude, over a range of each;

Increased compatibility of an intelligence-carrying signal with other signals that co-exist in a given frequency neighborhood (band);

A reduction or elimination of the typical external apparatus necessary to modulate and transmit a carrier with sampled or quantized information, also resulting in simplification of receiving apparatus used to select and decode transmissions of analog samples and/or digital information;

A universal data encoding apparatus for information transmission having the ability to accommodate a wide variety of data types such as: continuous analog, analog-sampled analog, digitally sampled analog and digital numeric/symbolic data;

A reduction in the amount and size of transmitter and receiver hardware required to realize a radio transceiver that may be located at the antenna feedpoint, eliminating the need for expensive transmission lines, waveguides, etc.;

In a system having a transmission antenna, or other narrow band transmission facility, therefore exhibiting resonance, provision of an antenna driving and coupling apparatus that considerably reduces or eliminates residual ringing, due to transmission facility resonance;

Asynchronous pulse signal generation by the signal generator mentioned above via a logic signal trigger input;

A pulse transmitter embodiment having pulse inversion (polarity changing) capability;

In the sinusoidal halfwave pulse train receiver mentioned above, polarity reversal detection capability;

In the sinusoidal halfwave pulse train receiver mentioned above, pulse-to-pulse (pulse interval) time measurement capability; and In the sinusoidal halfwave pulse train receiver mentioned above, pulse amplitude discrimination capability for the recovery of digital information or pulse amplitude sample and holding capability for the recovering of sampled analog information.

Features of this invention useful in accomplishing the above objects include, in an information transmission system, at least one halfwave sinusoidal pulse signal transmitter and compatible receiver, or at least one synchronized halfwave sinusoidal pulse train signal transmitter and compatible receiver conveying analog and/or digital information on a continuous serially sampled information-for-transmission basis. Utilizing multiple pulse train generators, any form of information-carrying signal may be synthesized via the superposition (linear summation) of a number of pulse train signals. This facilitates construction of a communications system, wherein an intelligent digital processing system, such as a microprocessor, computer, custom digital integrated circuit, etc., will be provided an efficient, cost effective circuit system to dynamically maximize the efficiency of signal intelligence transmission via the signal generation and synthesis methods which have been or will be identified in this specification, the resultant signaling efficiency being dynamically controllable relative to any or all changing conditions in information type and rate, signal path conditions, static and/or dynamic channel allocations, networking factors, etc.

Specific embodiments representing what are presently regarded as preferred methods of carrying out the invention are illustrated in the accompanying drawings.

Referring to the drawings:

FIG. 1 is a block schematic showing a sinusoidal halfwave pulse or pulse train transmitter-to-receiver information transmission system embodying principles of the present invention;

FIG. 2 is a more detailed block schematic showing an information source and sinusoidal halfwave pulse train transmitter implementation;

FIG. 3 is a more detailed block diagram of a pulse generating circuit that is a source element of the sinusoidal halfwave single pulse or pulse train generator;

FIG. 4 is a the driver circuit detail of the pulse generating circuit of FIG. 3;

FIG. 5 is a circuit detail of the pulse damper/buffer generating circuit of FIG. 3;

FIG. 6 is a differential tinging-suppressing driver circuit in a transmitter-to-signal-path coupling arrangement, driving a dipole transmit antenna;

FIG. 9 is a block diagram of a dipole antenna-fed pulse or pulse train signal, single or multiple channel receiver embodying principles of the present invention, the receiver having pulse width channel selectivity, pulse polarity data decoding and pulse amplitude data decoding;

FIG. 10 is a schematic of pulse width and polarity-discriminating circuits of the receiver of FIG. 9;

FIG. 11 illustrates pulse train signal waveforms produces to principles of the present invention;

FIG. 12 is a waveform diagram showing the signals involved in the pulse-generating and transmitting circuits of FIGS. 3, 4, 5 and 6;

FIG. 13 is a waveform diagram of the pulse width detection and amplitude decoding circuits of FIGS. 9 and 10;

FIG. 14 illustrates a waveform of a continuous wave signal at a receiving antenna as it is affected by summation with a pulse train signal having pulses synchronous with the continuous signal;

Figure 7:
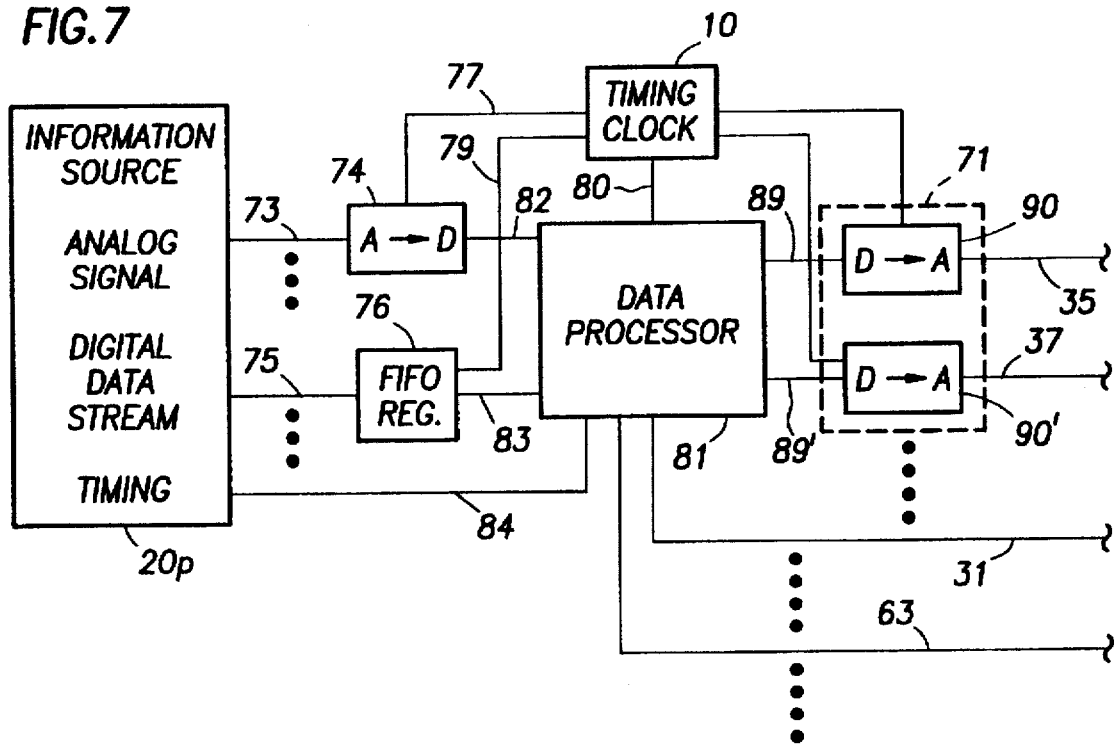
FIG. 7 is a block diagram of a multiple analog and digital input, multiple pulse width pulse train signal transmitter, embodying principles of the present invention.

The information signal source 20, of FIG. 1, feeds signaling through line 21 to sinusoidal halfwave pulse train transmitter 22. A pulse train signal from transmitter 22 is passed through path 23 to receiver 24 with information decoder output 25 passing data to information user (terminal) 26. The pulse train signal path 23 may be a transmission line conductor (wires or printed circuit traces, etc.), a fiber optic facility, laser beam carrier or other space signal propagation path, having a transmit antenna matched to the transmitter in the space signal propagation path case, and a receiving antenna input connected to a sinusoidal pulse signaling receiver. If complex signal synthesis is being accomplished via multiple sinusoidal pulse train summation, any type of previously existing receiver may be used.

In each of the signal information encoding methods related above, the use of very nearly sinusoidal pulses (sinusoidal discrete halfwaves) significantly reduces the dispersion of energy in the frequency domain as compared to a continuous carrier's modulation sideband frequency spread.

FIG. 11 illustrates examples of pulse trains as they may be applied. Shown in the figure as waveform 11a is a pulse train consisting of four discrete sinusoidal pulses of equal amplitude. The frequency spectrum placement of these pulses is graphically shown in diagram 11b. P1 identifies the first pulse in the train having a width (duration) PW1. Given a plurality of pulse widths in a pulse train, variation in pulse width is discernible as a particular data symbol, or as a particular channel in a frequency division multiplexed transmission system. Here, P1 might be used as a data framing symbol, indicating the beginning of a block (flame) of data. Pulse P3, having the same width as pulse P1, could be serving as an end-of-frame symbol, differentiated by pulse polarity. Pulses P2 and P4 having, respectively, pulse widths greater and less than PW1; may be data symbols, and in addition, polarity change may represent a binary digit (either 1 or 0). Pulse width may serve to indicate the digit's position in a numerical value or its destination address (i.e. in a digital memory). Given a plurality of pulse widths greater than two, each pulse may carry more than one bit of information. Two other parameters relating to pulse trains are designated in FIG. 11 as PP and PIP. PP indicates the absolute time of pulse generation or appearance, whereas PIP indicates elapsed time between two sequential pulses. The time of arrival of a pulse relative to an accurate clock and the time between pulses (pulse interval period) may both represent information. The quantity and accuracy of information related to pulse interval period and to the time of pulse arrival depends upon the accuracy and the granularity of the time references at both ends of the transmission system.

The pulse train waveform 11c of FIG. 11 shows pulses having two values of pulse amplitude. This method of transmitting information may be designated as binary pulse amplitude shift or amplitude change encoding. The receiver may be equipped with an amplitude comparator to discriminate between these two amplitude possibilities, thereby recovering a binary stream of data. Multiple amplitude values may be encoded to represent more than one digit of binary information. A more complex amplitude-comparing circuit would then be required in the receiver wherein individual pulse amplitude values are compared to an amplitude reference pulse, which could also be the framing pulse. Binary data as determined by pulse polarity reversal and amplitude shift from pulse-to-pulse is shown relative to the pulse trains in FIG. 11. Pulse train waveform 11d carries analog samples (A1, A2, A3, A4) rather than digital information via the amplitude of each pulse. Samples representing the true value of an analog signal may be taken at regular time intervals at the input of the transmitter of the system such that the original analog signal may be reconstructed at the system receiver via Nyquist filtering of the amplitude-varying, analog sample representing pulses. The pulse rate in this application must be at least twice that of the highest signal amplitude direction change rate (frequency) in the analog signal. Other than amplitude shift digital encoding as described above, all of the other digital encoding methods previously discussed may be utilized simultaneously with a sampled analog information, amplitude encoded pulse train.

A pulse train may be used to convey information in the presence of another signal having a frequency corresponding to pulse width. The maximum duty cycle of this type of pulse train, wherein interference with the information carried by a continuous wave signal is negligible, is variable, and is therefore best determined via actual practice. This is illustrated in FIG. 14 where Waveform 14a is a continuous sinusoidal signal waveform, wavefom 14b is a pulse train synchronized with the continuous signal, and waveform 14c is the combination of the previous two at a receiving antenna where the pulses of the pulse train are shown both in and out of phase with the halfwaves of the continuous wave (CW) signal. This effect will not be the same at all receivers in a system as the phase relationship of waveforms 14a and 14b vary, depending upon the distances between the two transmitters and the receiving antenna.

FIG. 2 shows the information source 20 having a data timing section 20', along with analog and digital information sources 20A and 20D with outputs 21A and 21D, respectively connected to sample and hold circuit 27 and to digital-to-analog (D-A) circuit 28. A timing clock 29 is connected via a two-way timing path connection 30 to the data timing interface 20', also having timing signal line connections, 31, 32 and 33, with respectively, pulse generation circuit 34, sample and hold circuit 27 and the digital-to-analog circuit 28. The output of sample and hold circuit 27 is connected through line 35 as a pulse width control input to pulse-generator circuit 34; the output of circuit 34 is connected as an input to amplifying and zero-crossing clipping circuit 34A via line 36. The digital-to-analog circuit 28 output is passed through line 37 as a gain control input to amplifier gain circuit 34A, which has an output line 38 connected as an input to transmission path coupler 39, connecting to or radiating into pulse signal path 23.

The timing clock 29 consists of digital logic circuitry, its primary function being to ensure that a pulse is not generated until the pulse width and amplitude control voltages, which depend upon the information data source 20, have been sampled or digitally registered; also, that these control voltages have had sufficient time to stabilize at the pulse generator and at amplifier inputs 35 and 37, and that the pulse width and amplitude controlling circuits in the pulse-generator circuit have stabilized. The information source data timing section (interface) 20' strobes the timing clock 29 as new data is presented. The timing clock then signals the sample and hold circuit 27 and/or the digital-to-analog circuit 28 to accept the data. Following a stabilization delay, the timing signal triggers the pulse generator 34 to produce a pulse. All timing signals are digital logic control signals having very fast rise and fall times. The pulse width control input of the pulse-generator circuit 34 is a DC voltage input, as is the amplitude control input of the gain circuit 34A. The sources of these signals may be as shown in FIG. 2, or, in applying analog sample information directly as pulse amplitude, the sample and hold circuit 27 output would be connected to the gain circuit gain control input, rather than to the pulse generator pulse width control input. Nothing precludes the use of two sample and hold circuits or two D-A circuits to control pulse width and amplitude.

The pulse generator 34 is the most significant circuit involved in the overall sinusoidal pulse transmitter 22. Referring additionally now to FIG. 3, pulse-generating circuit 34 includes a one-shot monostable multivibrator 46, having variable pulse width. This device provides the correct rectangular pulse duration as is shown in waveform 3B of FIG. 12, activating the following ringing circuit driver 47; therefore the timing clock 29 is not burdened to directly initiate pulse generation with digital logic activation pulses of the proper duration. One-shot circuit 46 input 31 is shown as waveform 2A in FIG. 12.

FIG. 3 shows more circuit detail of the pulse generator 34 and amplifier gain circuit 34A portions of the transmitter of FIG. 2. A positive voltage current source 40 is connected serially through inductor 41 and capacitor 42 to ground, forming a sinusoidal signal generating, resonant-ringing circuit. Time period (pulse width) DC control voltage on line 35 is passed through inductor 43 to the common junction between capacitor 44 and varactor diode 45, connected serially from the common junction between inductor 41 and capacitor 42 to ground. Edge triggering pulses through line 31, from timing clock circuit 29, actuate initial pulse-generating circuit 46 having an output line 48L to driver circuit 47. The current sinking output of driver circuit 47 is passed through resistor 48 to damper/buffer circuit 49, with the junction between resistor 48 and circuit 49 connected through line 50 to the common junction of the tinging circuit components; inductor 41 and capacitor 42. The output of circuit 49 is connected through line 36 as an input to the amplifier gain circuit 34A. The input signal on this line is shown as waveform 3C of FIG. 12. Amplifier 34A also receives DC gain control voltage through line 37, and polarity control logic signaling through line 63. Amplifier 34A outputs pulse signaling via line 38 to the transmission-path coupler 39.

Referring again to FIG. 12, the turn-on and turn-off delays of the NPN transistor 52 in the driver circuit 47, of FIGS. 3 and 4, are compensated by the energizing pulse (one-shot 46, output line 48L) period. As the driver turns on, current flows from V+ through inductor 41 with a sinusoidal voltage waveform developing across capacitor 42. The responses of reactive components 41, 42, 45, resistor 48, driver circuit 47, and damper circuit 49 all function together to generate the most sinusoidal voltage waveform possible at line 36.

The damper/buffer circuit 49 sinks current from line 50 in such a way as to deplete the ringing circuit of nearly all its energy in one halfwave (half-cycle) period ($\pi$ radians). Referring additionally now to FIG. 5, the active device in this circuit 49 is an N-channel JFET 56. The JFET is biased such that the ringing circuit is critically damped. As the voltage increases at line 50, the JFET conducts less, and therefore damping decreases during the first half of the pulse, thereafter increasing to its original value at the end of the pulse. This action eliminates undesired ringing and sinusoidal waveform distortion of the signal. The JFET 56 also acts as a voltage follower, reproducing its gate voltage at its source node via current flowing through its source resistor. Therefore the output impedance of the pulse generator is much lower than the impedance of the ringing circuit.

Another timing factor not previously detailed is that of the relationship of the energizing pulse period to the response of the ringing and damper circuits. As has been stated, the damper circuit 49 is initially biased to sink current at its maximum; therefore, the driver circuit 47 must sink current so as to compensate for this factor. Minimal distortion of the sinusoidal waveform occurs when the energizing logic pulse period causes the ringing circuit energy source to be removed with precision at a proper time relative to the damper circuit's response.

The pulse period control section of the pulse-generating circuit 34 in FIG. 3 includes the varactor diode 45, wherein the capacitance of this diode changes as the reverse biasing voltage across it changes. Pulse period DC control voltage 35 is fed through a choke 43 so as to not shunt the varactor's capacitance; a resistor in place of or in series with the choke may also serve this function. A choke is preferred as this minimizes time required for the control voltage to stabilize across the diode. Capacitor 44 is very large compared to the varactor's capacitance, therefore the series capacitance of the two components is nearly that of the varactor diode 45. Capacitor 44 serves to block the DC control voltage from affecting the ringing circuit. A similar circuit may be configured to control the pulse width of the energizing one-shot circuit 46. If only one pulse width is required in a system, or in the event that a more economical transmitter is realizable by using a plurality of fixed duration (width) pulse generators, pulse width controlling circuitry becomes unnecessary.

Circuitry of driver circuit 47 is shown in FIG. 4, to include an NPN transistor 52 with base connected to tap 53 of adjustable resistor 54 which is connected from logic pulse input line 48L to ground. The transistor emitter is connected through resistor 55 to ground, and the collector output is connected to resistor 48 and therethrough to damper/buffer 49 via line 50, which is also the signal connection to the resonant ringing circuit previously identified.

Damper/buffer 49 circuit detail is shown in FIG. 5 to include an N-channel junction field effect device 56 with input line 50 to the gate, the drain element connected to V+, the source element connected through resistor 57 to ground and also through capacitor 58 to output line 36.

The gain circuit 34A of FIG. 2 provides linear gain, pulse zero-crossing clipping and output polarity selection. The gain circuit 34A of the overall sinusoidal pulse transmitter 22 features a voltage controlled gain, class-B biased linear amplifier. Its bias cutoff voltage is equal to the initial and terminal halfwave pulse signal zero-crossing voltage. This type of amplifier operation removes the starting transient and ending zero-crossing undershoot of the pulse waveform at output 36, of the pulse generator. The gain circuit also features an inverting control input to reverse the polarity of the output signal. This effectively selects which of the two 180 degree phases of a sinusoidal fullwave (2 π radians) will be transmitted to generate alternating polarity pulse or wave trains. The input impedance of this amplifier must be high enough to ensure that it does not significantly affect the operation of damper/buffer circuit 49. It is also important that the gain control portion of the amplifier stabilize quickly, following the input of a new DC gain control voltage, thereby minimizing interpulse time in the generation of an amplitude vanting pulse train. Non-DC voltage gain control of the gain circuit will cause distortion of the otherwise sinusoidal waveform. This factor also applies to the pulse width control section of the pulse-generating circuit previously described.

While signal transmission can be via wire, fiber optics or laser beam, space signal propagation generally requires an antenna coupled to receive sinusoidal halfwave pulse output 38. FIG. 6 shows a detail of the transmission path coupler 39 of FIG. 2, configured as an antenna coupler. The pulse signaling of line 38, as shown in FIG. 6, is fed as an input to differential power amplifier 60 having a connection 61 to ground, a V+ supply 64 connection and a V− supply 65 connection with + and − output connections 66 and 67 across an antenna resistor bridge connection 68 between two antenna dipoles 69 and 70 of antenna 59; with the outer end of each dipole being grounded (to the voltage potential reference).

With respect to antenna coupler 39 and antenna 59, residual ringing, due to the inductance and capacitance resonance of the transmit antenna, is minimized as the antenna is driven differentially, as is shown in waveforms 6D and 6E of FIG. 12, including a shunting resistive bridge 68 to effectively reduce the resonant Q factor of the antenna so that it will not "ring" excessively. A single antenna with this arrangement will effectively radiate sinusoidal pulses over some range of pulse widths. Several pulse transmitters may share a balanced transmission facility that is terminated at the inputs of differential power amplifier 60. The antenna shunt resistor 68 may be as low in resistance as is the nonreactive impedance of the antenna 59, in which case the actual radiated power will be 3 dB less than the power output of the amplifier 60. The antenna 59 is center fed via positive and negative signals relative to the neutral or ground potential of the antenna's ends.

The multiple digital and analog input, multiple channel, pulse train signal transmitter of FIG. 7 receives information from analog and digital information data source 20P, having multiple information-channel lines 73 feeding a plurality of analog-to-digital converters 74. The data source 20P has additional multiple digital information-channel lines 75 feeding a plurality of first-in-first-out (FIFO) registers 76. Each of the plurality of analog-to-digital (A-D) converters 74 has a clock input through respective lines 77 from timing clock 78 that also feeds clock pulses through a plurality of lines 79 to the plurality of FIFO registers 76. Timing clock 78 feeds clock pulses through line 80 to data processor circuit 81 that also receives a plurality of digital inputs through lines 82 from the plurality of analog-to-digital circuits 74, and a plurality of digital inputs through lines 83 from the plurality of FIFO registers 76. The data processor 81 has a two-way data flow control connection line 84 to the information data source 20P. Data processor 81 has multiple digital outputs to a plurality of D-A converter pairs 71 via lines 89 and 89', pulse-generation timing logic outputs 31, and polarity selection logic outputs 63, all to a plurality of pulse transmitters 22.

Figure 8:
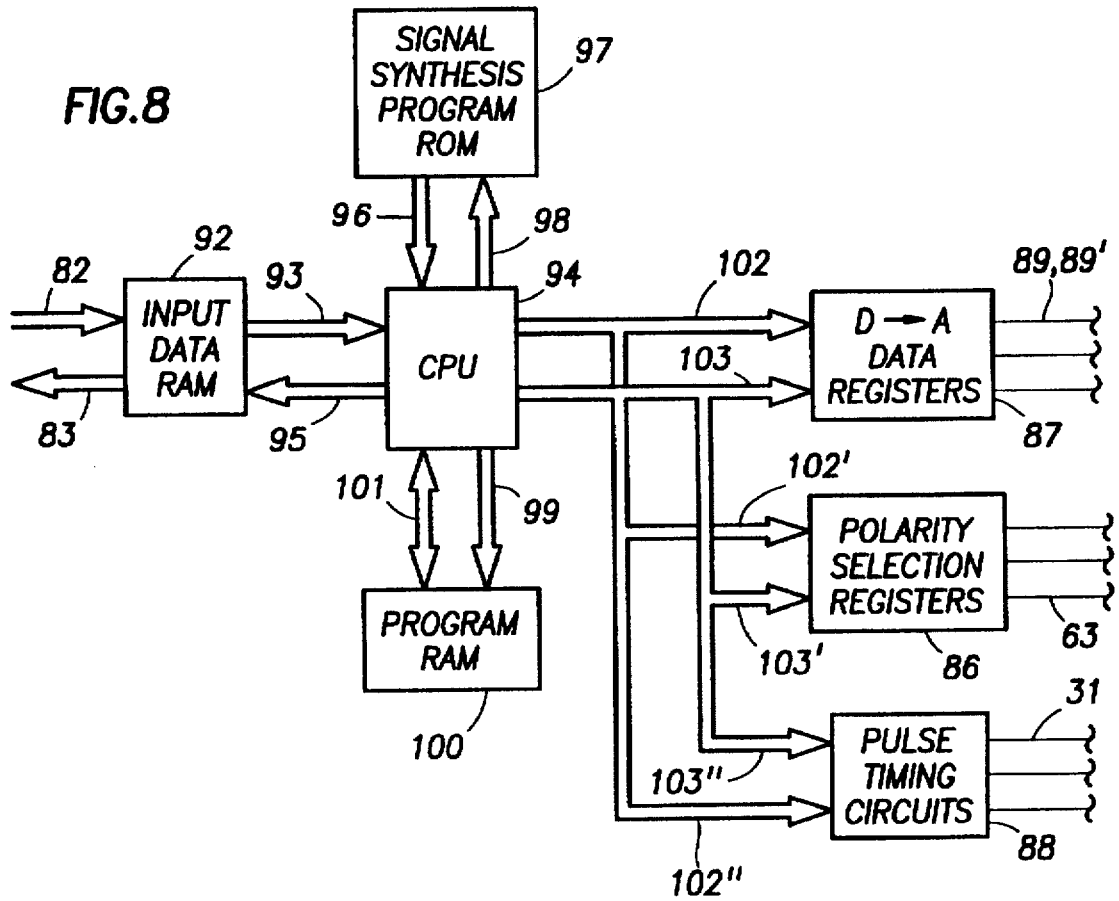
FIG. 8 is a block detail of a data processing system of the multiple pulse width pulse train transmitter of FIG. 7.

An operational diagram of the data processor system 81 of FIG. 7 is shown in FIG. 8 with output bus connections to the D-A data register 87, pulse timing circuits 88, and the polarity selection registers 86. The data processor 81 includes an input random access memory (RAM) section 92 with line 82 and line 83 bus inputs and a bus output 93 to CPU section 94 with an address bus 95. The CPU section 94 has an input bus 96 from a signal synthesis program ROM 97, an address bus 98, an address bus 99 to a program RAM 100, and a two-way bus 101 therebetween. CPU section 94 also has output busses 102 and 103 to D-A data registers 87, bus branches 102" and 103" to pulse timing circuits 88 and also bus branches 102' and 103' to polarity selection registers 86.

Various functional blocks in a digital processing system for the multiplexing and processing of multiple digital information signals into pulse parameter and timing control signals are represented in FIG. 8. Data from A-D converters 74, FIFOs 76, etc. enters an input buffer RAM memory 92 from the information source(s) via data busses 82 and 83. The type of output signal desired (AM, FM, etc.) is a digitally encoded input to a particular RAM memory location. The CPU 94 reads this information and loads the proper signal synthesizing program firmware from the signal synthesis program ROM 97 into the program RAM 100 for execution. The CPU then executes instructions in program RAM 100 causing data in the input data RAM 92 to be used to generate one or more sinusoidal pulse trains via the control it has over individual pulse timing, width, amplitude and polarity. Pulse generation times are loaded into the pulse timing circuits 88, and pulse polarity is loaded into digital registers 86, for each sinusoidal pulse transmitter 22. Pulse width information is loaded into digital registers 87 associated with the D-A converter pairs 90 and 91' that control pulse width and amplitude of each sinusoidal pulse generator. If the speed of the CPU 94 is insufficient to generate more than one pulse train, multiple CPUs may be configured, each with its own program RAM 100. In a multiple CPU configuration, each CPU sends data to its own set of pulse transmitters via its own output bus. One additional CPU or DSP could be used to process the input data into inverse Fourier information. In this processing system configuration, inverse Fourier pulse train parameters including timing information would be passed to the other CPUs via an additional data bus. Inverse Fourier sinusoidal half-wave signal pieces or segments are the frequency and amplitude parameters as would be measured if the resultant synthesized complex signal were analyzed with a wideband spectrum analyzer in real time (instantaneous time correlated measurement).

Figure 16:
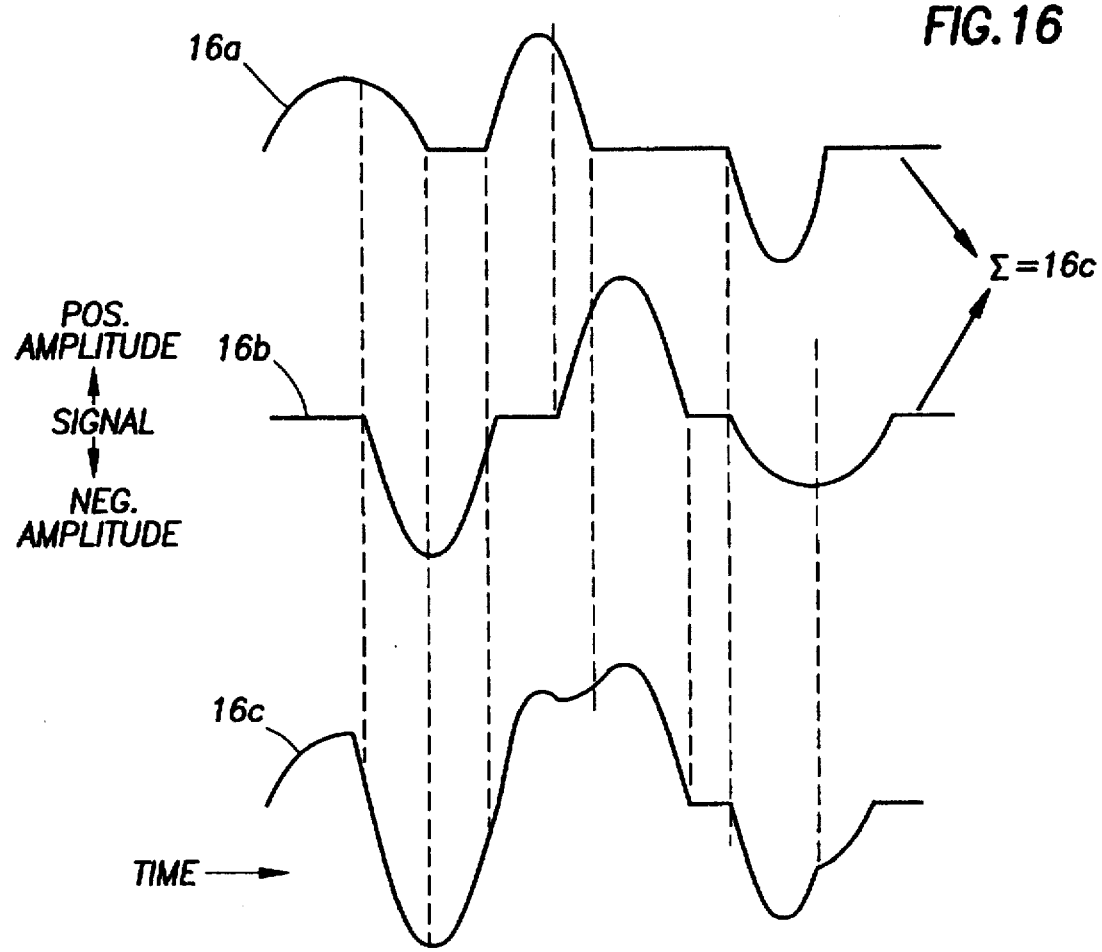
FIG. 16 is a waveform diagram showing the synthesis of a complex analog signal via linear summation of two synchronously generated pulse trains.

Inverse Fourier synthesis utilizing the superposition (linear summation) of sinusoidal pulse trains, accomplishes the object of generating any type of signal using a digital processing system controlling multiple sinusoidal pulse generators forming pulse trains, which are combined to form a complex signal which may have the same characteristics as existing modulated carrier signals; such as: AM, SSB, DSB , FM, FSK, PSK, etc. FIG. 16 illustrates the synthesis of a complex signal via the superimposition of two synchronized pulse trains. Waveforms 16a, and 16b are the pulse trains that result in the synthesized signal waveform 16c.

Figure 15:
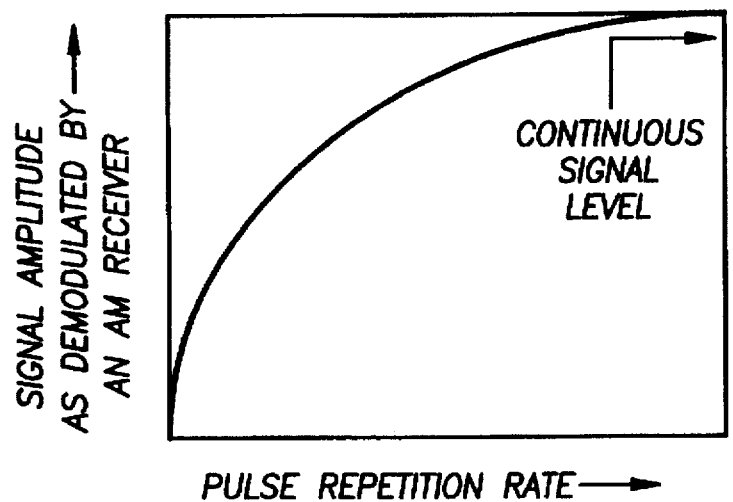
FIG. 15 is a diagram showing simulated amplitude modulation (AM) signaling via variance of a pulse repetition rate in a pulse train signal.

A method using a single pulse train generator 34 or multiple pulse train generators to simulate an AM signal is shown in FIG. 15, wherein the relationship shown is the function of sinusoidal pulse repetition rate producing an effective signal amplitude, which an AM receiver-demodulator will discern as being a continuous signal having an amplitude envelope. A very simple simulated AM signal may therefore be generated by simply frequency-modulating an astable multivibrator, the output of which determines pulse generation timing. A system of this type requires that pulse repetition rate vary according to the transmitter's information signal magnitude input. Another application of this is FM to AM signal conversion.

The sinusoidal pulse receiver 24, shown in FIG. 9, has a dipole antenna 104 feeding pulse train signal receiver front-end 105. The dipole antenna 104 is differentially coupled by antenna coupler 106 through line 106L to broadband preamplifier 107; this linear amplifier feeds the differential signal through line 107L to bandpass filter 108, which feeds pulse width detecting circuit section 110 of the receiver via line 109. As shown in FIG. 9, line 109 is the common input connection to all of the pulse width selective detectors 110 in a multiple channel (multiple pulse width) receiver. When a sinusoidal pulse having duration (width) corresponding to the resonance of a pulse width filter circuit 119 (see FIG. 10) of the detector 110 is received, pulse width detector 110 outputs logic pulses on lines 110W and 110W' to digital processor 113P. At the same time, the actual analog pulse amplitude is output on line 110A as a voltage signal to sample and hold circuits 149 and 151. The pulse-detected signal is used to alternately strobe the sample and hold circuits via digital processor 113P to preserve the pulse amplitude value. The pulse-to-pulse amplitude discriminator circuit 111 inputs these two amplitude signals on lines 112B and 112A, via sample and hold circuits 151 and 149 respectively, saving the amplitude information in every two consecutive pulses and then comparing them with voltage comparator 158 to derive a digital bit stream output on line 112C. This is accomplished as sample and hold circuit 149 outputs through resistor 157 to the positive input terminal of precision voltage comparator amplifier 158. Sample and hold circuit 151 has its output connected to the negative input terminal of precision voltage comparator 158. The output line 112C of amplifier 158 has a feedback (hysteresis) connection through resistor 160 to the positive terminal input of amplifier 158. Resistors 157 and 160 contribute to amplifier 158 hysteresis. Circuit 111 also outputs the sampled pulse amplitude voltages on lines 112A and 112B as analog inputs to information user 113. If no amplitude variations are in the pulse train, this entire circuit 111 is unnecessary. If amplitude samples, rather than amplitude shift encoding pulses are being received, only the two sample and hold circuits 149 and 151 in circuit 111 are necessary.

The receiver of FIG. 9 includes a digital processor 113P, which may be a programmable logic array device or devices. The pulse-detected output 110W of the pulse width detector 110, the digital output 112C of the amplitude discriminator, and the pulse detected output 110W' output of circuit 133' (see FIG. 10) are all inputs to processor 113P. Digital processor 113P may be programmed to determine digital values based upon the time between pulses (pulse position encoding) and to provide strobe signals via lines 148 and 150 to the sample and hold circuits 149 and 151. Processor 113P may also be programmed to perform error checking and correcting, and to organize received data according to whatever protocol the information user requires. Processor 113P may also be programmed to flag false pulse detection as determined by pulse timing. Control of pulse detection threshold as a function of pulse level versus average signal level in the receiver's bandpass is another program task that may be accomplished by processor 113P via a D-A circuit 102A, the output of which is connected to the pulse detector threshold control input 117 of pulse detector circuit 110. The gain of amplifier 115 (see FIG. 10) in pulse detector 110 may also be adjusted by the processor 113P in a similar manner via D-A circuit 102B having input line 102D and output line 117L to the gain control input of amplifier 115. Processor 113P outputs data to the information user 113 via line 113L.

FIG. 10 is a detailed schematic diagram of pulse width detector circuit 110. The differential transmission line 109, shown in FIG. 9 terminates as two inputs 109' and 109" of differential amplifier 115, having output lines 116A and 116B connected respectively and serially through resistors 117A and 117B and inductors 118A and 118B to ground. In forming passive pulse width filter circuit 119, the junction of resistor 117A and inductor 118A is connected through capacitor 120A to ground on one side of the circuit, as is the junction of resistor 117B and inductor 118B, through capacitor 120B to ground on the other side of the circuit. Two phase-shift networks, capacitor 121 in series with inductor 122, and inductor 123 in series with capacitor 124 are connected between the two circuit sides identified above, inductor 122 is connected to the B side, inductor 123 is connected to the A side. The junction of capacitor 121 and inductor 122 is connected serially through the primary winding 126 of transformer 125 and capacitor 127 to the junction of inductor 123 and capacitor 124.

In forming pulse-plus-noise to noise comparators 133 and 133', the secondary winding 128 of transformer 125, being the output of passive pulse width filter circuit 119, has its center tap connected through line 129 to the cathode of diode 130, also through the diode anode to V+ voltage and to bypass capacitor 129C, the other end of which is grounded. The top end of secondary winding 128 is connected serially through resistor 131 to the cathode of diode 132, and through the diode to V+ voltage thereby forming with diode 130, a halfwave rectifier circuit. The secondary winding 128 top end is also connected, as an output, through line 134 to the junction of the anodes of diodes 135 and 136 and through resistor 137 and capacitor 138 to ground and also through resistor 139 to ground forming a DC filter circuit. At an output of this filter circuit, the junction of resistor 137 and capacitor 138 is connected through resistor 141 to the positive input of a voltage comparator (limiting high-gain amplifier) 142, and also through resistor 143 to the output 144 of amplifier 142. The 110A output of pulse width detecting circuit 110 is AC-coupled through capacitor 145 from the junction of diode 136 and resistor 146 having an adjustable tap 147 connected to the negative input of amplifier 142. The bottom end of resistor 146 is connected to the drain of field effect transistor 148 having its source connected to ground and its gate having a threshold control voltage input via line 117. Line 117 is connected through resistor 117' to the gate of FET 148, with the gate also connected through resistor 148R to ground. The output line 144 of amplifier 142 is connected as the trigger input to non-retriggerable one-shot multivibrator circuit 149. Resistor 151 is connected to a terminal of circuit 149, and through a capacitor 152, resistor 151 is connected to another terminal of circuit 149, thereby determining the duration of the output logic pulse on line 110W. This logic pulse signals the detection of a sinusoidal pulse of selected width.

Pulse polarity reversal detection is embodied via the addition of a second pulse-plus-noise to noise comparator circuit 133' connected, as is circuit 133, except to the bottom of transformer 125 secondary winding 128 via line 134'. Processor 113P is then programmed to detect a change in the order of pulses arriving from the two pulse-plus-noise to noise comparators 133, 133' via lines 110W and 110W' indicating a polarity reversal.

Referring to FIG. 13, waveform 10A, as also referenced in FIG. 10, is a sinusoidal pulse. The specific form of the pulse depends upon its phase position when the receiving antenna 104 transduces the transmit signal electromagnetic field energy. The pulse being received, whatever its phase, appears at the node referenced 10A in FIG. 10, and also at the node referenced 10B in an inverted (180-degree phase-shifted) form. The resonant circuits consisting of inductor 118A with capacitor 120A, and 118B with 120B, reduce the energy content (amplitude) of all signals with the exception of the selected pulse width signal, corresponding to the resonance of these circuits. Phase shift networks consisting of inductor 123 with capacitor 124, and inductor 121 with capacitor 122, are such that a pulse having the correct width will be lead-shifted via the capacitors and lag-shifted via the inductors, resulting in a fullwave (bipolar) voltage signal across the primary winding of transformer 125, as is shown as 10C or 10C' in FIG. 13. The peaks of this wave will appear above and below the peaks of other signals at the output of transformer 125. Capacitor 127 is sized so that it resonates with the inductance of transformer 125 at the desired pulse width. Transformer 125 may be a voltage step-up device, driving the two halfwave rectifiers of the following pulse-plus-noise to noise comparator.

The pulse width discriminating filter 119 in the receiver 24 described above may be made to have variable pulse width (tuning) capability via capacitance varying circuitry, in the same manner as is the pulse generator tinging circuit in the previously described transmitter 22.

In pulse-plus-noise to noise comparator circuit 133 of FIG. 10, diode 132 removes the negative going input signal; diode 136 passes the positive; and diode 130 DC-balances the circuit with respect to transformer 125. The signal passing through diode 136 is not filtered; however; it is attenuated by potentiometer 146 in series with FET 148. The signal passing through diode 135 is filtered by resistor 137 and capacitor 138 producing a DC voltage that corresponds to the rectified average of all AC voltages passing through pulse filter 119. As the unfiltered rectified waveform shown as 10D (or as 10D' in comparator 133', see FIG. 13) in FIG. 10 rises above this average, it is detected by voltage comparator 142. The detection threshold will move up and down in level according to the amplitude, quantity, and phase relationships of all the AC signals passing through; however, the pulse (width) filtered signal will rise above this threshold. As "noise" energy varies and as signal strength varies due to propagation changes, the threshold for peak detection is maintained. Field effect transistor 148 modifies the signal attenuation performed by potentiometer 146. This allows external control of the peak detection level relative to the average, filtered signal level. The halfwave rectified analog signal is AC-coupled (via capacitor 145) as a signal source to sample and hold circuits 149 and 151 of the pulse amplitude discriminator 111 of FIG. 9. The pulse detected output 110W of the pulse detector circuit 110, shown as waveform 10H in FIG. 13, is generated by a non-retriggerable one-shot multivibrator 149, resistor 151 and capacitor 152 determining the output pulse duration. One-shot multivibrator circuit 149 serves to prevent noise, (which may overcome the hysteresis of comparator 142) from causing false pulse detection. Waveform 10G shows the effect of noise riding on the sinusoidal pulse signal. Other signals identified in FIG. 13 include waveform 10E, the filtered signal as described above, and the two voltage comparator threshold levels (per hysteresis function), shown as 10F (and as 10F' in the comparator 133'), appearing at the positive input of comparator 142. Pulse amplitude sampled levels are shown as sample and hold circuit output signals 9K and 9K', referenced in FIG. 9, where 9K is an even sample and 9K' is a subsequent odd sample. Also in FIG. 13, SPtw designates pulse width in terms of time, and SPtpp designates interpulse period (pulse-to-pulse time).

Whereas, this invention is illustrated and described with respect to several embodiments thereof, it should be realized that various changes may be made without departing from essential contributions to the art made by the teachings hereof.

I claim:

1. A single sinusoidal halfwave pulse signal system comprising: a positive voltage source connected serially through inductive and capacitive means to a voltage potential reference source, thereby forming sinusoidal ringing circuit means; said ringing circuit means activated by driver circuit means, with said driver circuit means sinking current through said inductive means, to said voltage potential reference source; said driver circuit consisting of an active semiconductor device; said semiconductor device being biased so as to cause said ringing circuit means response to be as sinusoidal as possible; said driver circuit being activated by a logic pulse; said logic pulse duration compensating for driver circuit delays; said ringing circuit means being de-energized by damping and buffering circuit means consisting of an active semiconductor device connected to the same node as said driver circuit means; said damping and buffering circuit semiconductor device being biased so as to complement the action of said driver circuit means while sinking current to said voltage potential reference source, so as to cause said ringing circuit means to produce a sinusoidal halfwave, having minimal distortion; the output of said sinusoidal halfwave pulse generator means being via a voltage follower configuration of said semiconductor device in said damping and buffering circuit means.

2. A sinusoidal halfwave pulse signal system comprising:

sinusoidal halfwave pulse-generating means;

signal transmission medium coupling means including ringing suppression means;

means structured for transmitting at least one sinusoidal halfwave pulse signal carrying message intelligence according to at least one of pulse duration width, pulse reception time and pulse propagation time, said transmitting means including at least two pulse train generators having their outputs combined into one transmitter output signal;

digital information input multiplexing feeding a digital data-processing system having digital data-processing means with software program control, said digital data-processing means controlling duration width, power content, amplitude, polarity and timing of sinusoidal halfwave pulses generated by said at least two pulse train generators, with summation of the pulse train generator outputs being any form of pulse signaling as determined by communication system specifications and requirements; and an error rate information feedback input from a receiver, said digital data-processing system including software programming for maintaining maximum information transmission efficiency as propagation path, data rate, and other factors vary.

3. A single sinusoidal halfwave pulse signal circuit comprising: differential signal means feeding signaling via two differential feed lines connected serially through respective resistors and inductors to ground with the junction of the resistor and inductor of one feed line and the junction of the resistor and inductor of the second feed line each connected through a respective resonating capacitor to ground, each connection of the same junctions then being fed serially through an inductor and capacitor to the other connection of the same junctions; the junction of one of said two inductors with its respective capacitor being connected serially through a resonating capacitor to one end of the primary winding of a signal transmitting transformer; the junction of the other of said two inductors with its respective capacitor being connected to the other end of the primary winding of said signal transmitting transformer; and the secondary winding of said transformer being the output medium of the signal circuit.

4. The pulse signal circuit of claim 3, further comprising pulse width selection variance utilizing varactor diodes for varying the capacitance of resonating and phase-shifting circuits in the circuit.

5. A sinusoidal halfwave pulse signal system, comprising: an input coupling arrangement feeding signaling from a transmission path medium to a low-noise preamplifying means having sufficient signal gain to overcome bandpass filtering loss, the preamplifying means feeding the signaling through a bandpass filtering means to a differential amplifier which feeds differential signaling to a sinusoidal halfwave pulse filtering means, the sinusoidal halfwave pulse filtering means feeding a selected signal to the input of a pulse-plus-noise to noise comparator circuit means having two input rectifiers, the output of one rectifier being DC filtered, the output of the other rectifier not being DC filtered, the unfiltered output being compared with the filtered output via a precision voltage comparator having hysteresis, and the output of said voltage comparator triggering a one-shot multivibrator having a logic pulse output indicating the detection of a discrete sinusoidal halfwave pulse signal having a selected pulse width.

6. The signal system of claim 5, further comprising at least one of pulse train pulse interval time measurement, pulse to pulse amplitude change discernment, pulse amplitude analog sample holding and outputting, and pulse to pulse polarity change discernment, as additional means of signal information decoding.

7. The signal system of claim 5, further comprising at least two pulse width selective detector circuits for use with a transmission system capable of transmitting a plurality of pulse widths in a single sinusoidal pulse train signal.

8. A sinusoidal halfwave pulse signal system, comprising:

a plurality of sinusoidal pulse generators, each of said pulse generators being capable of producing a pulse train;

a data processor connected to each of said pulse generators, said data processor being capable of receiving analog and digital data;

a clock connected to said data processor, a plurality of digital-to-analog converters interconnected between said data processor and said plurality of pulse generators, said clock being connected to each of said digital-to-analog converters; and wherein said data processor includes a central processing unit interconnected with each of a program read-only memory, a program random-access memory, a plurality of digital-to-analog data registers, each of said digital-to-analog data registers being interconnected to one of said digital-to-analog converters, a plurality of polarity selection registers, and a plurality of pulse timing circuits, and each of the digital-to-analog data registers, polarity selection registers, and pulse timing circuits being interconnected to one of said pulse generators, whereby said data processor is capable of processing analog and digital data to thereby output pulse-generation timing logic and polarity selection logic to each of said pulse generators, and whereby said data processor is capable of controlling pulse width and pulse amplitude for each of said pulse trains.

9. The pulse signal system according to claim 8, further comprising means for linearly summing outputs of each of said pulse generators together to thereby produce a complex signal.

* * * * *